US008955678B2

(12) United States Patent
Murphy et al.

(10) Patent No.: US 8,955,678 B2
(45) Date of Patent: Feb. 17, 2015

(54) PROTECTIVE CASES FOR MOBILE ELECTRONIC COMMUNICATION DEVICES (71) Applicant: Pelican Products, Inc., Torrance, CA (US)

(72) Inventors: Andrew Murphy, St. John's NL (CA); Matthew Gawlowski, Woodland Park, CO (US)

(73) Assignee: Pelican Products, Inc., Torrance, CA (US)

( * ) Notice: Subject to any disclaimer, the term of this patent is extended or adjusted under 35 U.S.C. 154(b) by 4 days.

(21) Appl. No.: 13/830,180

(22) Filed: Mar. 14, 2013

(65) Prior Publication Data
US 2014/0265762 A1 Sep. 18, 2014

(51) Int. Cl.
H05K 5/00 (2006.01)
H04M 1/18 (2006.01)
H04B 1/38 (2006.01)

(52) U.S. Cl.
CPC ............. *H05K 5/0086* (2013.01); *H04M 1/18* (2013.01); *H04B 2001/3894* (2013.01)
USPC ........................................................ 206/320

(58) Field of Classification Search
USPC ............... 206/320, 811; 224/666; 361/679.02
See application file for complete search history.

(56) References Cited

U.S. PATENT DOCUMENTS

| 3,019,715 A | 2/1962 | Arnold et al. |
| 3,205,409 A | 9/1965 | Owerko |
| 4,584,718 A * | 4/1986 | Fuller ............................ 455/351 |
| 4,663,879 A | 5/1987 | Bergeron, Jr. |
| 4,682,363 A | 7/1987 | Goldfarb et al. |
| 4,733,776 A | 3/1988 | Ward |
| 4,823,397 A | 4/1989 | Hewitt |
| 4,836,256 A | 6/1989 | Meliconi |

(Continued)

FOREIGN PATENT DOCUMENTS

| DE | 298 11 904 | 9/1998 |
| EP | 1 583 251 | 10/2005 |

(Continued)

OTHER PUBLICATIONS

Stealth Black iPhone 4/4s EscapeCapsule. Catalyst Waterproof. Retrieved Oct. 3, 2013, from http://www.catalystlifestyle.com/products/ec-stealth.
Survivor+Catalyst Waterproof—Our New Waterproof Case for iPhone 5. Griffin Technology. Retrieved Oct. 3, 2013, from http://griffintechnology.com/survivor/waterproof.

(Continued)

*Primary Examiner* — Steven A. Reynolds
*Assistant Examiner* — King M Chu
(74) *Attorney, Agent, or Firm* — Foley & Lardner LLP (57) ABSTRACT A protective case for a mobile electronic communication device having a user input interface includes a front cover configured to couple with a rear cover to define a volume for receiving the mobile electronic communication device, the front cover having an aperture aligned with the user input interface when the mobile electronic communication device is received in the volume; a transparent membrane provided between the front cover and the rear cover to be disposed over the user input interface when the mobile electronic communication device is received in the volume; and a compressible member arranged between the front cover and the membrane and separate from the front cover, the transparent membrane configured to provide a seal between the transparent membrane and the front cover when the mobile electronic communication device is received in the volume and the front cover is coupled to the rear cover.

29 Claims, 8 Drawing Sheets

(56) References Cited

U.S. PATENT DOCUMENTS

| | | | |
|---|---|---|---|
| 5,025,921 A | 6/1991 | Gasparaitis et al. | |
| 5,128,829 A | 7/1992 | Loew | |
| 5,175,873 A * | 12/1992 | Goldenberg et al. | 455/351 |
| 5,239,324 A | 8/1993 | Ohmura et al. | |
| 5,325,139 A | 6/1994 | Matsumoto | |
| 5,388,692 A * | 2/1995 | Withrow et al. | 206/320 |
| 5,555,157 A | 9/1996 | Moller et al. | |
| 5,568,358 A | 10/1996 | Nelson et al. | |
| 5,648,757 A * | 7/1997 | Vernace et al. | 340/539.32 |
| 5,733,023 A | 3/1998 | Lee | |
| 5,737,183 A | 4/1998 | Kobayashi et al. | |
| 5,812,188 A | 9/1998 | Adair | |
| 5,850,915 A | 12/1998 | Tajima | |
| 5,956,656 A | 9/1999 | Yamazaki | |
| 6,031,524 A * | 2/2000 | Kunert | 345/173 |
| 6,068,119 A | 5/2000 | Derr et al. | |
| 6,201,867 B1 * | 3/2001 | Koike | 379/433.11 |
| 6,239,968 B1 | 5/2001 | Kim et al. | |
| 6,266,240 B1 | 7/2001 | Urban et al. | |
| 6,349,824 B1 | 2/2002 | Yamada | |
| 6,356,442 B1 | 3/2002 | Lunsford | |
| 6,396,769 B1 | 5/2002 | Polany | |
| 6,415,138 B2 | 7/2002 | Sirola et al. | |
| 6,434,403 B1 | 8/2002 | Ausems et al. | |
| 6,456,487 B1 | 9/2002 | Hetterick | |
| 6,469,752 B1 | 10/2002 | Ishikawa et al. | |
| 6,471,056 B1 | 10/2002 | Tzeng | |
| 6,519,141 B2 | 2/2003 | Tseng et al. | |
| 6,536,589 B2 | 3/2003 | Chang | |
| 6,614,722 B2 | 9/2003 | Polany et al. | |
| 6,646,864 B2 | 11/2003 | Richardson | |
| 6,659,274 B2 | 12/2003 | Enners | |
| 6,719,381 B2 | 4/2004 | Cleereman et al. | |
| 6,781,824 B2 | 8/2004 | Krieger et al. | |
| 6,819,549 B1 | 11/2004 | Lammers-Meis et al. | |
| 6,842,633 B1 | 1/2005 | Deo et al. | |
| 6,865,076 B2 | 3/2005 | Lunsford | |
| 6,926,141 B2 * | 8/2005 | Montler | 206/320 |
| 6,954,405 B2 * | 10/2005 | Polany et al. | 367/131 |
| 6,995,976 B2 * | 2/2006 | Richardson | 345/173 |
| 7,011,213 B2 | 3/2006 | Clark et al. | |
| 7,050,712 B2 | 5/2006 | Shimamura | |
| 7,061,762 B2 | 6/2006 | Canova et al. | |
| 7,069,063 B2 | 6/2006 | Halkosaari et al. | |
| 7,099,149 B2 | 8/2006 | Krieger et al. | |
| 7,158,376 B2 | 1/2007 | Richardson et al. | |
| 7,180,735 B2 | 2/2007 | Thomas et al. | |
| 7,194,086 B2 | 3/2007 | Pletikosa | |
| 7,194,291 B2 | 3/2007 | Peng | |
| 7,230,823 B2 | 6/2007 | Richardson et al. | |
| 7,263,032 B2 | 8/2007 | Polany et al. | |
| D557,897 S | 12/2007 | Richardson et al. | |
| 7,312,984 B2 | 12/2007 | Richardson et al. | |
| 7,324,642 B2 | 1/2008 | Pletikosa | |
| 7,352,961 B2 | 4/2008 | Watanabe et al. | |
| 7,400,917 B2 | 7/2008 | Wood et al. | |
| D581,421 S | 11/2008 | Richardson et al. | |
| 7,449,650 B2 | 11/2008 | Richardson et al. | |
| 7,535,799 B2 | 5/2009 | Polany et al. | |
| 7,609,512 B2 | 10/2009 | Richardson et al. | |
| 7,613,386 B2 | 11/2009 | Shimamura | |
| 7,620,174 B1 | 11/2009 | Bick | |
| 7,641,046 B2 | 1/2010 | Tsang et al. | |
| 7,663,878 B2 | 2/2010 | Swan et al. | |
| 7,663,879 B2 | 2/2010 | Richardson et al. | |
| 7,688,580 B2 | 3/2010 | Richardson et al. | |
| 7,729,493 B2 | 6/2010 | Krieger et al. | |
| 7,755,975 B2 | 7/2010 | Pettersen et al. | |
| 7,789,228 B2 | 9/2010 | Zenzai | |
| 7,810,683 B2 | 10/2010 | Chan | |
| 7,876,550 B1 | 1/2011 | Albertini et al. | |
| 7,889,489 B2 | 2/2011 | Richardson et al. | |
| 7,907,394 B2 * | 3/2011 | Richardson et al. | 361/679.3 |
| 7,920,163 B1 | 4/2011 | Kossin | |
| 7,929,847 B2 | 4/2011 | Yim | |
| 7,933,122 B2 * | 4/2011 | Richardson et al. | 361/679.55 |
| 7,957,524 B2 | 6/2011 | Chipping | |
| 8,044,942 B1 | 10/2011 | Leonhard et al. | |
| 8,051,980 B2 | 11/2011 | Tai et al. | |
| 8,054,614 B2 | 11/2011 | Albertini et al. | |
| 8,068,331 B2 | 11/2011 | Sauers et al. | |
| 8,077,453 B2 | 12/2011 | Swan et al. | |
| 8,215,483 B2 | 7/2012 | Wakitani et al. | |
| 8,240,530 B2 | 8/2012 | Fletcher et al. | |
| 8,245,842 B2 | 8/2012 | Bau | |
| 8,286,789 B2 | 10/2012 | Wilson et al. | |
| 8,342,325 B2 | 1/2013 | Rayner | |
| 8,368,748 B2 | 2/2013 | Ho | |
| 8,374,495 B2 | 2/2013 | Yim | |
| 8,390,255 B1 | 3/2013 | Fathollahi | |
| 8,393,466 B2 | 3/2013 | Rayner | |
| 8,417,303 B2 | 4/2013 | Ladouceur et al. | |
| 8,453,835 B2 * | 6/2013 | So | 206/320 |
| 8,503,170 B1 * | 8/2013 | Hsu et al. | 361/679.02 |
| 8,584,847 B2 * | 11/2013 | Tages et al. | 206/320 |
| 8,687,351 B2 * | 4/2014 | Yturralde et al. | 361/679.02 |
| 2001/0002003 A1 | 5/2001 | Kuzdak et al. | |
| 2001/0002725 A1 | 6/2001 | Pollet et al. | |
| 2002/0080567 A1 | 6/2002 | Bone et al. | |
| 2002/0195910 A1 | 12/2002 | Hus et al. | |
| 2003/0095374 A1 | 5/2003 | Richardson | |
| 2003/0142471 A1 | 7/2003 | Krieger et al. | |
| 2003/0151890 A1 | 8/2003 | Huang et al. | |
| 2007/0070813 A1 | 3/2007 | Kuo | |
| 2007/0080446 A1 | 4/2007 | Maloney | |
| 2007/0280053 A1 | 12/2007 | Polany et al. | |
| 2008/0316687 A1 * | 12/2008 | Richardson et al. | 361/680 |
| 2009/0017883 A1 | 1/2009 | Lin | |
| 2009/0017884 A1 | 1/2009 | Rotschild | |
| 2009/0206001 A1 * | 8/2009 | Sasaki et al. | 206/711 |
| 2009/0303673 A1 | 12/2009 | Holzhausen | |
| 2009/0312058 A9 | 12/2009 | Wood et al. | |
| 2010/0008028 A1 | 1/2010 | Richardson et al. | |
| 2010/0048267 A1 * | 2/2010 | Lin | 455/575.8 |
| 2010/0147737 A1 | 6/2010 | Richardson et al. | |
| 2010/0200456 A1 | 8/2010 | Parkinson | |
| 2010/0203850 A1 | 8/2010 | Norris et al. | |
| 2010/0328203 A1 | 12/2010 | Hsu | |
| 2011/0036876 A1 | 2/2011 | Fathollahi | |
| 2011/0073608 A1 | 3/2011 | Richardson et al. | |
| 2011/0157800 A1 * | 6/2011 | Richardson et al. | 361/679.01 |
| 2011/0163642 A1 | 7/2011 | Rohrbach et al. | |
| 2011/0195759 A1 | 8/2011 | Griffin et al. | |
| 2011/0228458 A1 * | 9/2011 | Richardson et al. | 361/679.01 |
| 2012/0000908 A1 * | 1/2012 | So | 220/281 |
| 2012/0039023 A1 | 2/2012 | Renwick | |
| 2012/0043235 A1 * | 2/2012 | Klement | 206/320 |
| 2012/0074005 A1 | 3/2012 | Johnson et al. | |
| 2012/0118773 A1 * | 5/2012 | Rayner | 206/320 |
| 2012/0244915 A1 | 9/2012 | Hawkins et al. | |
| 2012/0262618 A1 * | 10/2012 | Weakly | 348/333.01 |
| 2012/0302294 A1 * | 11/2012 | Hammond et al. | 455/567 |
| 2013/0042581 A1 * | 2/2013 | Holben et al. | 53/473 |
| 2013/0126372 A1 * | 5/2013 | Song | 206/320 |
| 2013/0146491 A1 * | 6/2013 | Ghali et al. | 206/320 |

FOREIGN PATENT DOCUMENTS

| | | |
|---|---|---|
| JP | 2008-153058 | 7/2008 |
| WO | WO-2012/002899 | 1/2012 |

OTHER PUBLICATIONS

Hitcase for iPhone 4/4s—The World's Most Versatile iPhone Case. Hitcase. Retrieve Oct. 3, 2013, from http://www.hitcase.com/hitcase.

Incipio—Atlas—iPhone 5 Waterproff Cases, IncipioTV. Published Jan. 15, 2013, available at http://www.youtube.com/watch?v=7dRWednhByM.

Atlas Waterproof Case—Where you go, Atlas Goes. Incipio. Retrieved Oct. 3, 2013, from http://atlas.incipio.com, 2013.

Optrix XD5 for iPhone 5, 5s—Turn your iPhone into a Sports Action Video Camera. Optrix. Retrieved Oct. 3, 2013, from http://www.optrix.com/optrix-xd5,2013.

(56) References Cited

OTHER PUBLICATIONS

Waterproof Cases—Cases for iPhone 5, iPhone 4, and iPhone 4s. Outdoor Technology. Retrieved Oct. 4, 2013, from http://www.outdoortechnology.com/Shop/Cases/.

Seidio, Obex Waterproof Case—Redesigned for the Samsung Galaxy S4. Seidio. Retrieved Oct. 3, 2013, from http://www.seidio.com/obex/.

aXtion Pro for iPhone 5. The Joy Factory. Retrieved Oct. 3, 2013, from http://www.thejoyfactory.com/product/cwd100.

Cases. Snow Lizard. Retrieved Oct. 4, 2013, from http://www.snowlizardproducts.com/cases/13-slxtreme-5-.html.

EPO Official Action dated Sep. 22, 2014, from related European Patent Application No. 14159864.9.

* cited by examiner

PROTECTIVE CASES FOR MOBILE ELECTRONIC COMMUNICATION DEVICES

BACKGROUND

1. Field

The disclosure relates generally cases and, in particular embodiments, to protective cases for mobile electronic communication devices.

2. Background

Mobile electronic communication devices, such as smart phones, tablets, or the like, typically contain sensitive and/or delicate electronics or other components. These devices can be subject to physical abuse and risks of damages from handling of the devices, especially given the portable nature of the devices (e.g., dropping of the devices, or otherwise subjecting the devices to physical shocks or other damage, etc.). Mobile electronic communication devices typically include housings that can withstand a certain level of physical shock. However, in an effort to improve aesthetics, the housings are typically designed to have finishes that look appealing, but often at the compromise of structural integrity. A nicely finished housing can be more prone to damage, including slight blemishes that may be more noticeable on such finishes. For example, the housings for some smart phones are finished with a highly polished metal back panel. Dents and/or scratches on the finished panel can be highly noticeable. Accordingly, a protective case that encloses some or the entire mobile electronic communication device can provide an additional level of protection to the sensitive electronics and the housing of the mobile electronic communication device.

SUMMARY OF THE DISCLOSURE

Embodiments of the present disclosure relate to a protective case for a mobile electronic communication device having a user input interface. A protective case according to various embodiments includes a rear cover, a front cover, a transparent membrane, and a compressible member. The front cover is configured to couple with the rear cover. The front cover and the rear cover define a volume for receiving the mobile electronic communication device when the front cover is coupled to the rear cover. The front cover has an aperture aligned with the user input interface of the mobile electronic communication device when the mobile electronic communication device is received in the volume. The transparent membrane is provided between the front cover and the rear cover to be disposed over the user input interface of the mobile electronic communication device when the mobile electronic communication device is received in the volume and the front cover is coupled to the rear cover. The compressible member is arranged between the front cover and the membrane and separate from the front cover. The transparent membrane is configured to provide a seal between the transparent membrane and the front cover when the mobile electronic communication device is received in the volume and the front cover is coupled to the rear cover.

In various embodiments, the compressible member is attached to the transparent membrane.

In various embodiments, the transparent membrane is not attached to the front cover.

In various embodiments, the transparent membrane and the compressible member are removable from the front cover and the rear cover.

In various embodiments, the compressible member is arranged to seal against a first rear surface of the top cover around the aperture of the top cover when the mobile electronic communication device is received in the volume and the front cover is coupled to the rear cover.

In some embodiments, the rear cover has a peripheral wall having a top surface facing the front cover when the front cover is coupled to the rear cover. The rear cover includes a rib extending upward from the top surface of the peripheral wall and around at least a portion of the volume. The rib is arranged to seal against a second rear surface of the top cover when the mobile electronic communication device is received in the volume and the front cover is coupled to the rear cover.

In further embodiments, the second rear surface is arranged further from the top surface of the front cover than the first rear surface.

In further embodiments, the first rear surface is arranged closer to a center point of the protective case than the second rear surface.

In various embodiments, the rear cover has a peripheral wall having a top surface facing the front cover when the front cover is coupled to the rear cover. The rear cover includes a rib extending upward from the top surface of the peripheral wall and around at least a portion of the volume. The rib is arranged to seal against a rear surface of the top cover when the mobile electronic communication device is received in the volume and the front cover is coupled to the rear cover.

In various embodiments, the protective case is configured to provide a first seal between the compressive member and a first surface of the front cover and a second seal between a rib portion of a peripheral wall of the rear cover and a second surface of the front cover. In some embodiments, the second seal is arranged further from the top surface of the front cover than the first seal. In some embodiments, the first seal is arranged closer to a center point of the protective case than the second seal.

In various embodiments, the protective case further includes at least one coupling member for coupling the front cover to the rear cover.

In some embodiments, the at least one coupling member is configured to force the front cover against the compressible member to enhance the seal between the transparent membrane and the front cover when the mobile electronic communication device is received in the volume and the front cover is coupled to the rear cover.

In various embodiments, the compressible member is adhered to the transparent membrane with an adhesive.

In various embodiments, the compressible member comprises a foam material.

In various embodiments, the compressible member comprises a urethane material.

In various embodiments, the compressible member defines an aperture aligned with the aperture of the front cover and the user input interface of the mobile electronic communication device when the mobile electronic communication device is received in the volume and the front cover is coupled to the rear cover.

In various embodiments, at least a portion of the transparent membrane is configured to be received on at least a portion of the rear cover.

In various embodiments, the transparent membrane comprises a body portion and at least one tab portion extending from the body portion. The at least one tab portion is configured to extend over at least a portion of a peripheral wall of the rear cover.

In some embodiments, the at least one tab portion is received into a recess provided in the peripheral wall of the rear cover.

In various embodiments, the transparent membrane comprises a body portion and at least one tab portion extending from the body portion. The at least one tab portion is configured to extend beyond a periphery of the mobile electronic communication device when the mobile electronic communication device is received in the volume and the front cover is coupled to the rear cover.

In various embodiments, the transparent membrane comprises a body and at least one tab portion extending from the body portion, the transparent membrane including an opening through each of the least one tab portion. The rear cover includes at least one opening, each opening at a position to align with a corresponding one of the at least one opening of the transparent membrane when the mobile electronic communication device is received in the volume and the front cover is coupled to the rear cover. The front cover includes at least one protrusion at one or more positions to extend through a corresponding one of the at least one opening of the transparent membrane and into a corresponding one of the at least one opening of the rear cover when the mobile electronic communication device is received in the volume and the front cover is coupled to the rear cover.

In some embodiments, the at least one opening of the rear cover is provided in a peripheral wall of the rear cover.

In various embodiments, the transparent membrane includes at least one opening through the transparent membrane. The rear cover includes at least one opening, each at a position to align with a corresponding one the at least one opening of the transparent membrane when the mobile electronic communication device is received in the volume and the front cover is coupled to the rear cover. The front cover includes at least one protrusion at one or more positions to extend through a corresponding one of the at least one opening of the transparent membrane and into a corresponding one of the at least one opening of the rear cover when the mobile electronic communication device is received in the volume and the front cover is coupled to the rear cover.

In various embodiments, the mobile electronic communication device is a separate unit from the protective case.

In various embodiments, the user input interface of the mobile electronic communication device is a touchscreen display.

Further embodiments relate to methods of manufacturing a protective case for a mobile electronic communication device having a user input interface. According to various embodiments, a method includes: providing a rear cover; configuring a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume; providing a transparent membrane provided between the front cover and the rear cover to be disposed over the user input interface of the mobile electronic communication device when the mobile electronic communication device is received in the volume and the front cover is coupled to the rear cover; and arranging a compressible member arranged between the front cover and the membrane and separate from the front cover, the transparent membrane configured to provide a seal between the transparent membrane and the front cover when the mobile electronic communication device is received in the volume and the front cover is coupled to the rear cover.

Embodiments of the present disclosure relate to an enclosure for mobile electronic communication device having a switch movable between a first position and a second position ace. A protective case according to various embodiments includes a protective case and a rotatable member. The protective case defines a volume for receiving the mobile device. The front cover has an aperture aligned with the user input interface of the mobile electronic communication device when the mobile electronic communication device is received in the volume. The rotatable member is arranged in a recess through a peripheral wall of the protective shell. The rotatable member configured to operatively engage the switch of the mobile device to move the switch between the first position and the second position when the mobile device is received in the cavity of the protective shell.

In various embodiments, the rotatable member is configured to rotate in a first direction to move the switch from the first position to the second position. The rotatable member is configured to rotate in a second direction to move the switch from the second position to the first position.

In various embodiments, the rotatable member has a first engagement surface and a second engagement surface. The first engagement surface is configured to engage the switch during rotation of the rotatable member in the first direction to cause the switch to move to the second position. The second engagement surface is configured to engage the switch during rotation of the rotatable member in the second direction to cause the switch to move to the first position.

In various embodiments, the rotatable member includes a first portion and a second portion operatively engaged with the first portion and the switch of the mobile device. At least a portion of the first portion is arranged external to the protective case for rotation of the first portion of the rotatable member. The rotatable member is configured such that rotation of the first portion causes rotation of the second portion to move the switch between the first position and the second position.

In some embodiments, one of the first portion and the second portion has a recess for receiving a tab of the other of the first portion and the second portion to operatively engage the first portion and the second portion.

In various embodiments, the rotatable member has an indicator for indicating whether the switch is at the first position or the second position.

In various embodiments, the protective case has a marker designating a position of the rotatable member that corresponds to the switch being in second position.

DETAILED DESCRIPTION

Figures 1A, 1B:
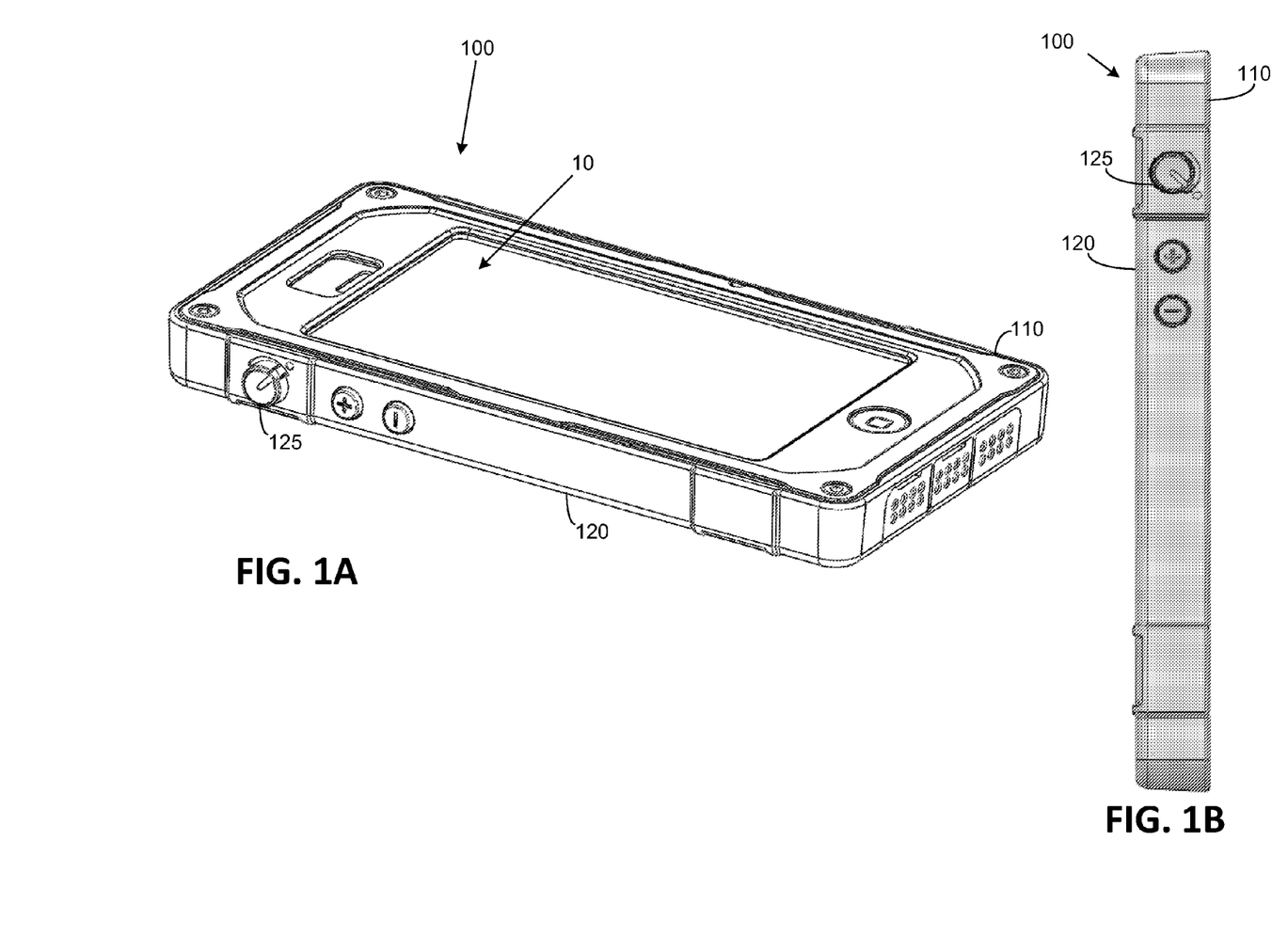
FIG. 1A is a perspective view of a protective case according to various embodiments of the disclosure.
FIG. 1B is a side view of a protective case according to various embodiments of the disclosure.
Figure 2:
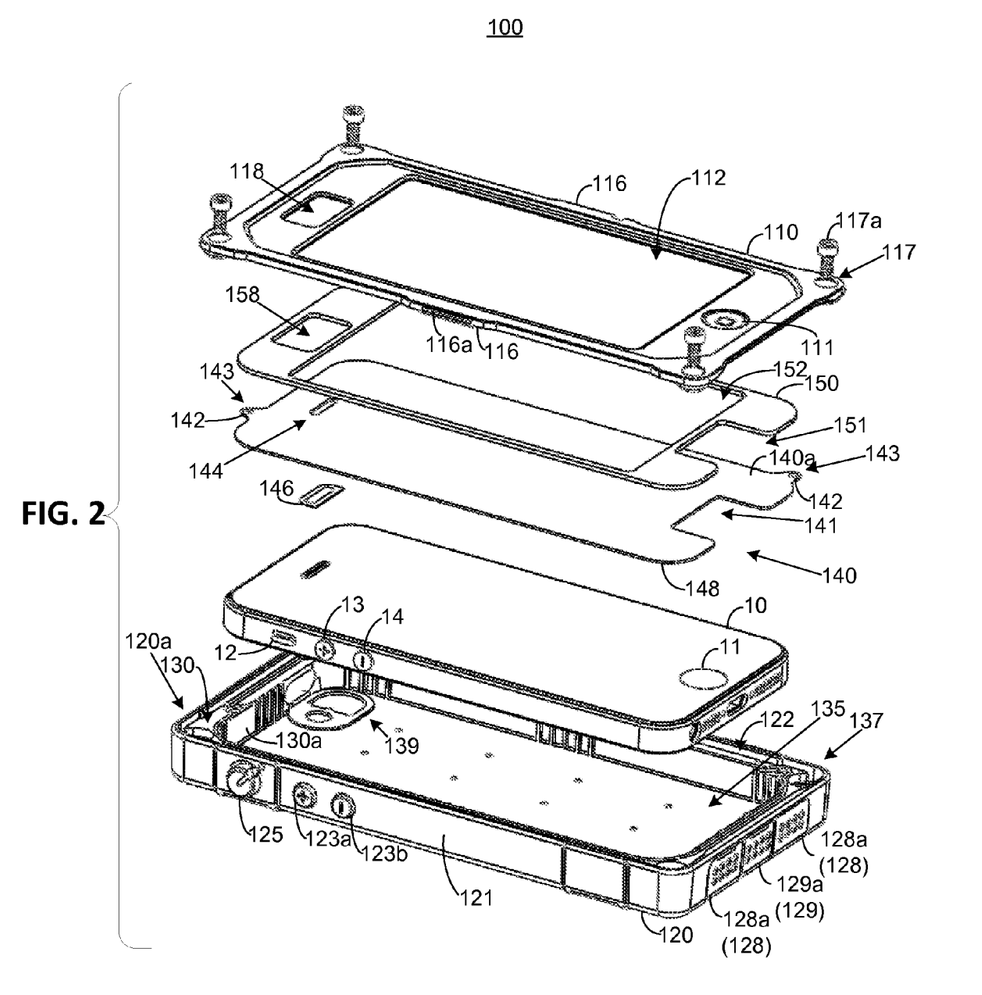
FIG. 2 is an exploded view of a protective case according to various embodiments of the disclosure.
Figure 3A:
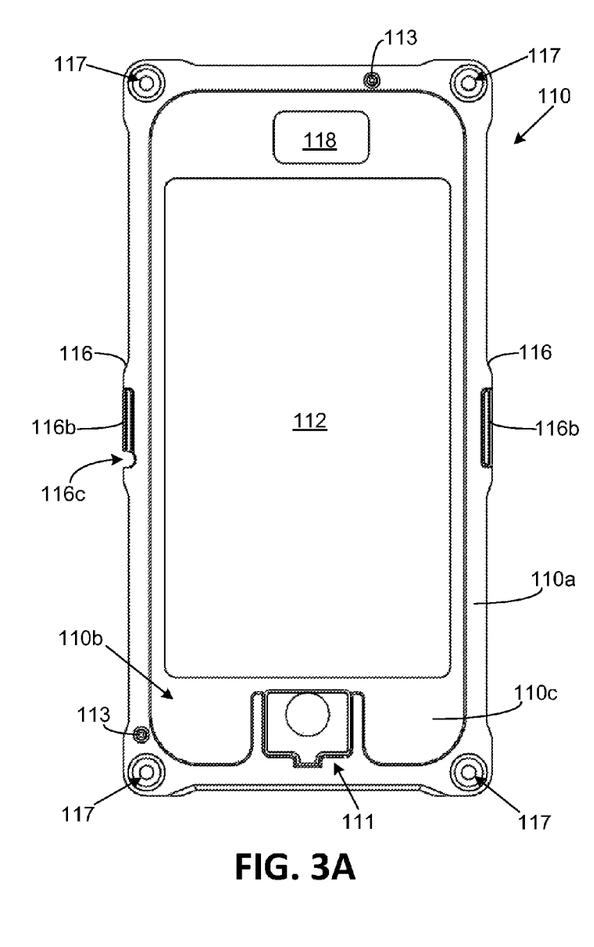
FIG. 3A is a view of a front cover of a protective case according to various embodiments of the disclosure.
Figure 3B:
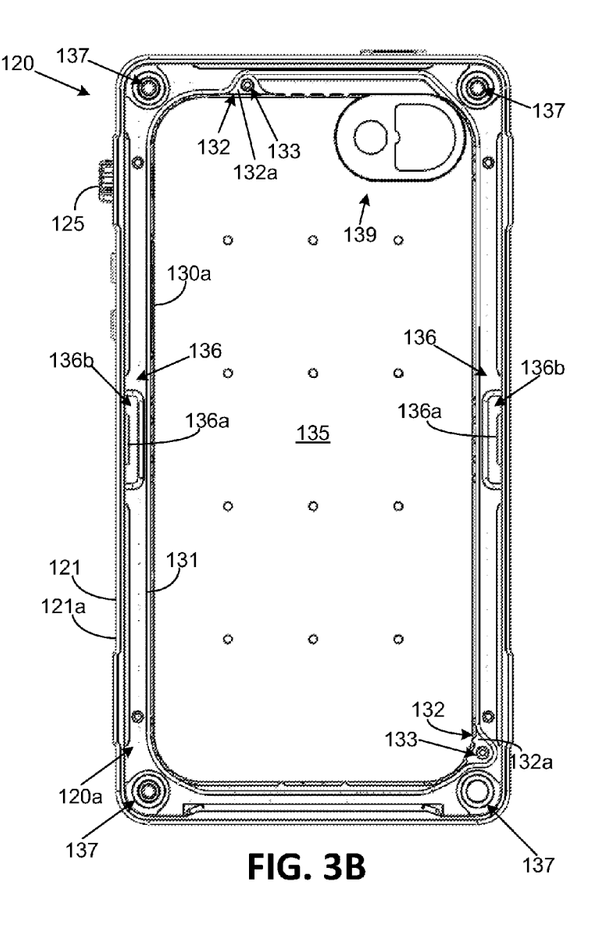
FIG. 3B is a view of a rear cover of a protective case according to various embodiments of the disclosure.
Figure 4A:
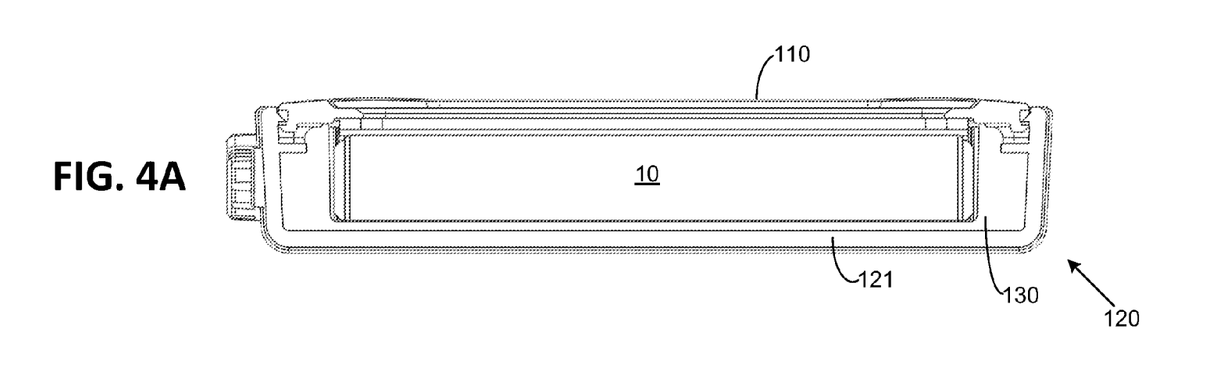
FIG. 4A is a cross-section view of a protective case according to various embodiments of the disclosure.
Figure 4B:
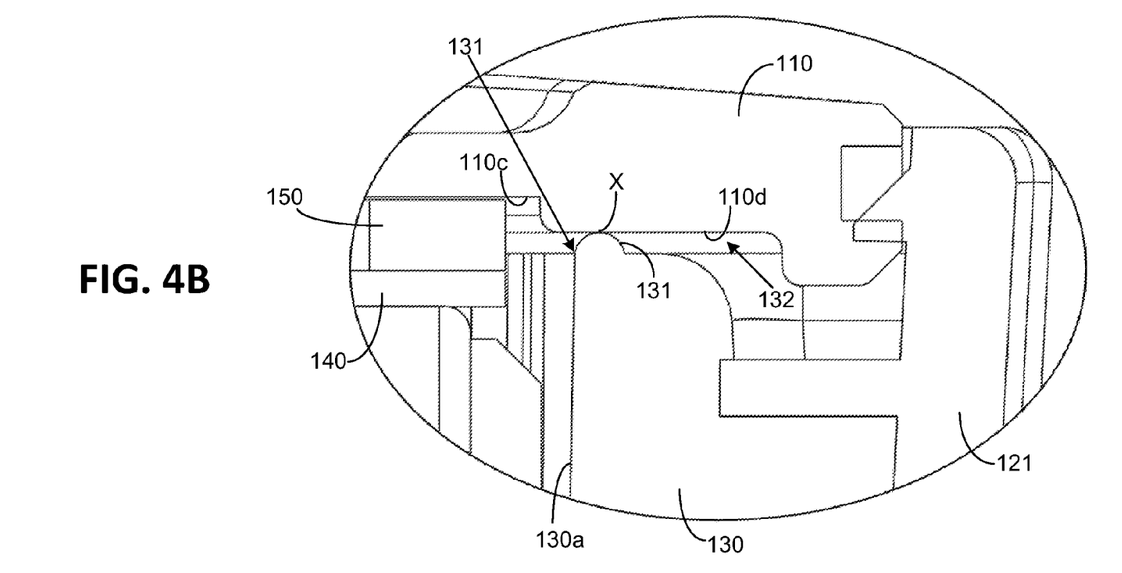
FIG. 4B is a portion of the protective case of FIG. 4A according to various embodiments of the disclosure.
Figure 5A:
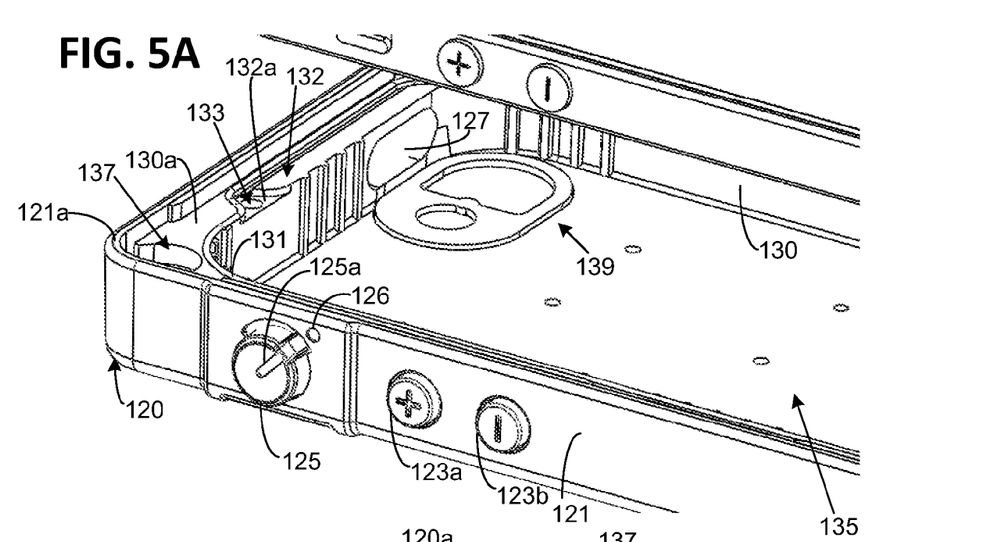
FIGS. 5A-5C are perspective views of portions of a protective case according to various embodiments of the disclosure.
Figure 5B:
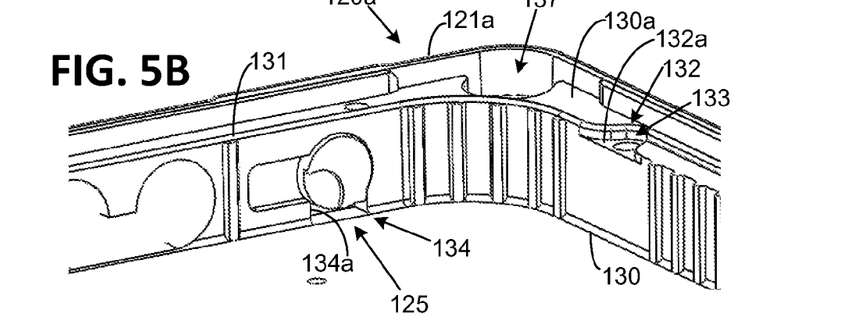
Figure 5C:
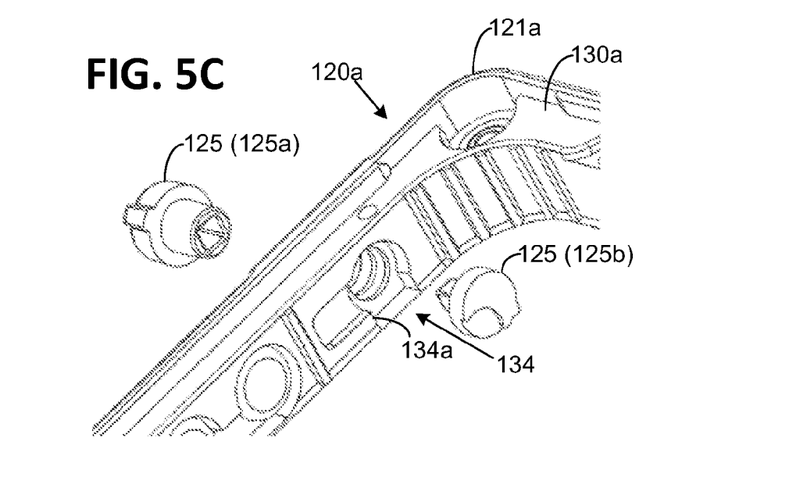
Figure 6A:
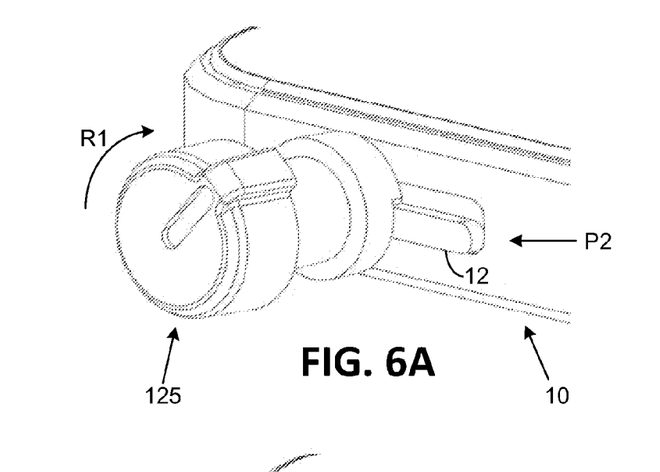
FIGS. 6A-6D are perspective views of a rotatable member for a protective case according to various embodiments of the disclosure.
Figure 6B:
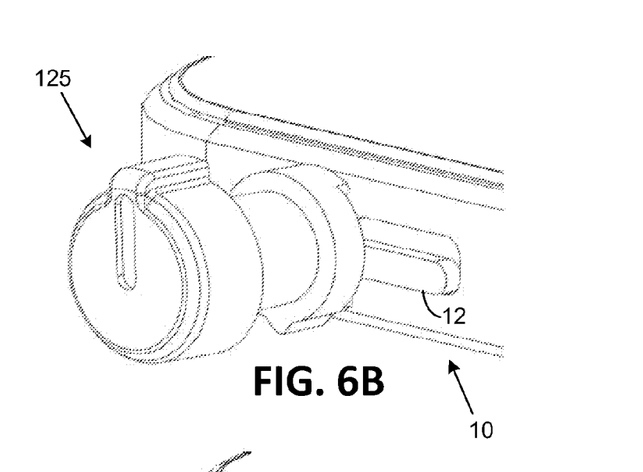
Figure 6C:
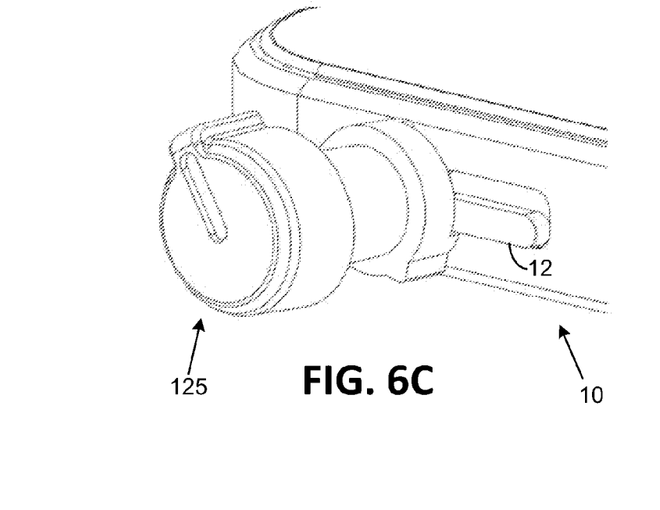
Figure 6D:
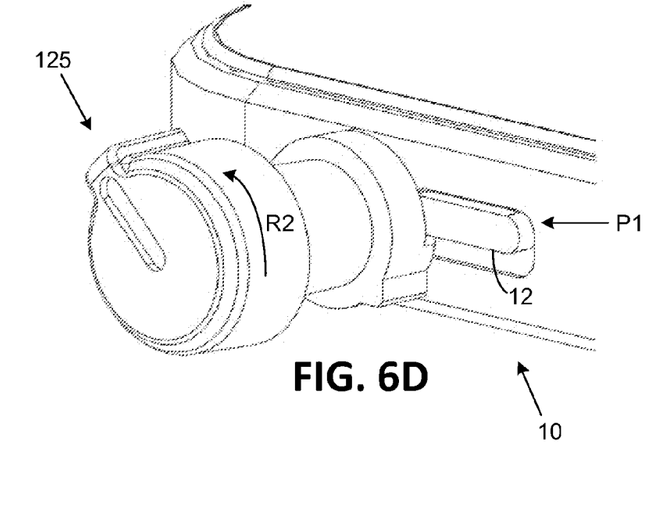
Figure 7A:
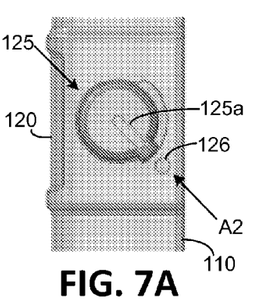
FIGS. 7A-7C are perspective views of a portion of an interior of a protective case according to various embodiments of the disclosure.
Figure 7B:
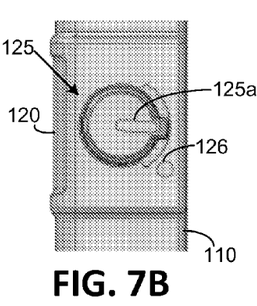
Figure 7C:
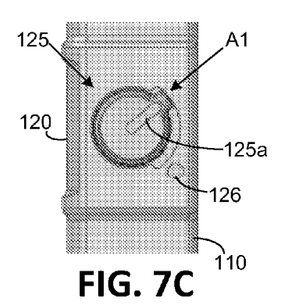
Figure 8A:
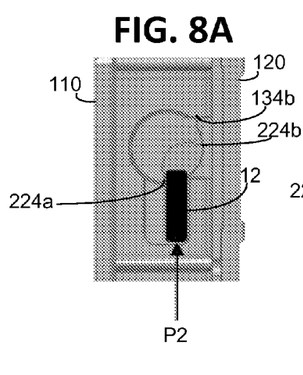
FIGS. 8A-8C are perspective views of a portion of an exterior of a protective case according to various embodiments of the disclosure.
Figure 8B:
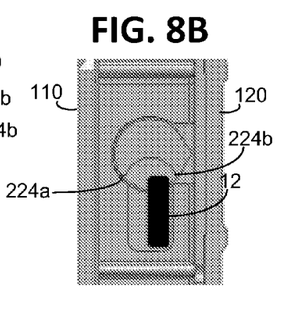
Figure 8C:
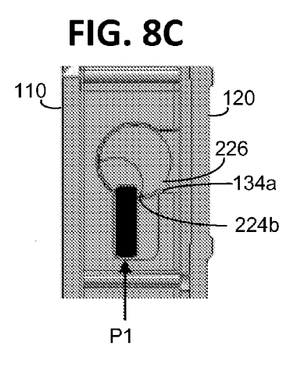
Figure 9A:
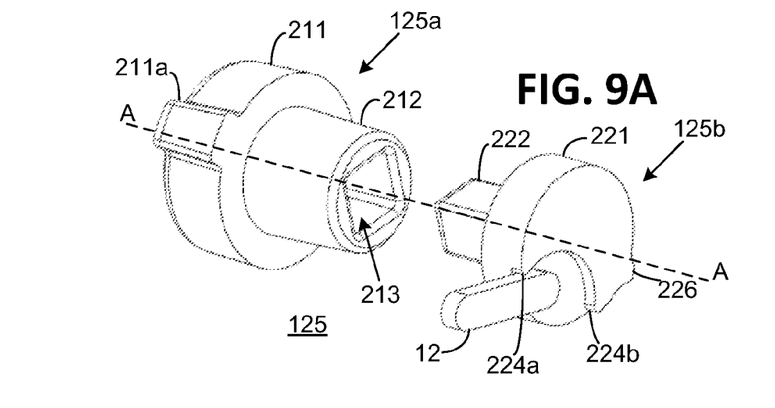
FIGS. 9A-9B are perspective views of a rotatable member according to various embodiments of the disclosure.
Figure 9B:
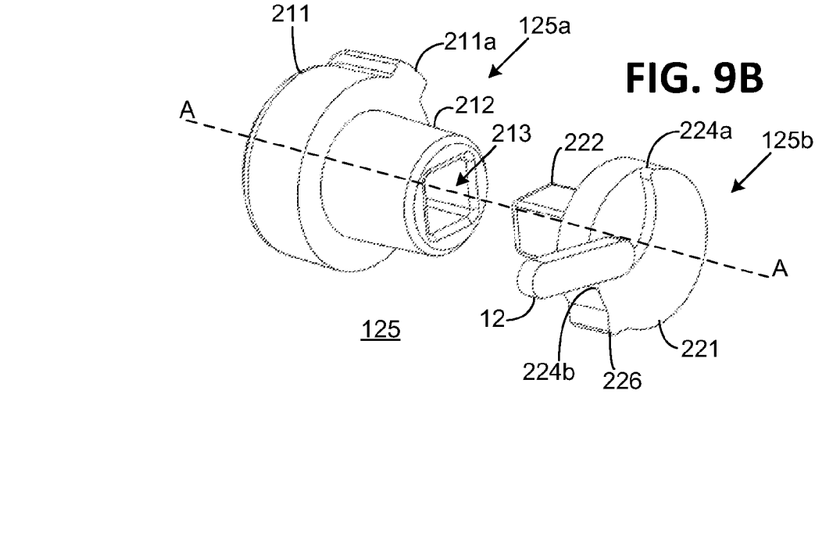

FIGS. 1A and 1B illustrate a protective case 100 for a mobile electronic communication device 10. The protective case 100 includes a front cover 110 and a rear cover 120 that, when coupled, form a volume in the protective case 100. The volume of the protective case 100 is configured to hold the mobile electronic communication device 10, such as (but not limited to) a smart phone (e.g., iPhone) (or other cell phone), a tablet (e.g., iPad), a personal data assistant (PDA), a laptop, an MP3 player, a music player, a video player, a media player, a navigational device, a telematics devices, or other portable electronic device. The mobile electronic communication device 10 includes a display device (e.g., LCD screen, etc.), a user input interface (e.g., keyboard, touchscreen interface, etc.) for providing an input or otherwise interacting with the mobile electronic communication device 10, and/or the like. In particular embodiments, the mobile electronic communication device 10 includes a touchscreen for the display device and the user input interface.

With reference to FIGS. 1-5C, the front cover 110 and/or the rear cover 120 may be made of any suitable material. In particular, the front cover 110 and/or the rear cover 120 may be made from materials that are capable of providing one or more of shock and liquid resistance to an encased mobile electronic communication device when the front cover 110 and the rear cover 120 are coupled. In some embodiments, the front cover 110 and the rear cover 120 are composed of a plurality of different components and therefore may be fabricated from a plurality of different materials. Suitable materials from which the front cover 110 and/or the rear cover 120 may be made of include rigid, semi-rigid, flexible, or any other type of material adapted to provide a corresponding desired amount of protection to the mobile electronic communication device 10 (e.g., shock and/or liquid resistance) including, but not limited to, plastic, metal, polycarbonate, nylon, liquid crystal polymer, rubber, thermal plastic urethane, polyethylene, polypropylene, a combination thereof, a mixture thereof, and/or the like.

In various embodiments, the protective case 100 completely encloses the mobile electronic communication device 10. For instance, the front cover 110 and the rear cover 130, when coupled together, may completely enclose the mobile electronic communication device 10. In other embodiments, the protective case 100 only covers a portion of the mobile electronic communication device 10. As such, a remaining portion of the mobile electronic communication device 10 may remain exposed.

The rear cover 120 includes an outer body 121. The outer body 121 includes a peripheral wall 121a. In particular embodiments, the rear cover 120 also includes a liner 130 having a peripheral wall (or sidewall) 130a. The liner 130 is provided in a cavity 122 defined the peripheral wall 121. In such embodiments, the peripheral wall 121a of the outer body 121 and the peripheral wall 130a of the liner 130 form a peripheral wall 120a of the rear cover 120. The liner 130 may be an elastomeric liner or other suitable material, such as (but not limited to) plastic, metal, polycarbonate, nylon, liquid crystal polymer, rubber, thermal plastic urethane, polyethylene, polypropylene, a combination thereof, a mixture thereof, and/or the like. In particular embodiments, the rear cover 120 and the liner 130 may be formed together (e.g., using an overmold process). In other embodiments, the rear cover 120 and the liner 130 is made separately and joined together. In particular embodiments, the liner 130 is removable from the rear cover 120.

The mobile electronic communication device 10 may be mounted or otherwise arranged in the protective case 100 in any suitable manner. In some embodiments, the mobile electronic communication device 10 may be received in the rear cover 120. For instance, the peripheral wall 120a defines a cavity 135 for receiving (at least a portion of) the mobile electronic communication device 10. In other embodiments, the mobile electronic communication device 10 is mounted to the protective case 100 by attaching the mobile electronic communication device 10 to the protective case 100, for example, with a fastener, adhesive, and/or the like.

In some embodiments, the front cover 110 and the rear cover 120 are configured to couple or mate in any suitable manner to enclose the mobile electronic communication device 10 in the protective case 100. In particular embodiments, at least a portion of the front cover 110 is received into a portion (e.g., cavity 122) of the rear cover 120. For example, the front cover 110 may include a wing or tab 116 received into an alcove 136 in the sidewall 130a of the liner 130. In further embodiments, the tab 116 may include a rib portion 116b that is received into a corresponding groove 136b when the tab 116 is received into the alcove 136. In further embodiments, the alcove 136 may include a ridge 136a provided on a side periphery of the alcove 136 that is received into a corresponding groove 116 on a side periphery of the tab 116. It should be noted that such coupling configurations for the front cover 110 and the rear cover 120 are exemplary and other embodiments may implement other suitable coupling configurations. For example, the ridge 136a could instead be provided on the side periphery of the tab 116 and the groove 136b could be provided in the side periphery of the alcove 136 to receive the ridge. Likewise, the front cover 110 can include the alcove 136 and the liner 130 can have the tab 116.

The front cover 110 has a first aperture 112 that allows access to the front surface, such as the user input interface (e.g., touchscreen interface) of the mobile electronic communication device 10, one or more of the operators, and/or the like of the mobile electronic communication device 10 through a membrane 140 provided over at least a portion of the mobile electronic communication device 10. In some embodiments, the front cover 110 includes at least one second aperture 118 (or otherwise provides access) for allowing access to at least one other portion of the mobile electronic communication device 10, such as one or more of a front-facing camera, microphone, proximity sensor, etc.

In particular embodiments, the front cover 110 and the rear cover 130, when coupled together, along with the membrane 140 completely encloses the mobile electronic communication device 10. The membrane 140 may be a sheet of thin plastic or other suitable material, for example, that allows interaction with the mobile electronic communication device 10 (e.g., the touchscreen display of the mobile electronic communication device 10). The membrane 140 may be transparent (or at least partially transparent) to allow images displayed on the touchscreen display of the mobile electronic communication device 10 to be visible through the membrane 140. The configuration (e.g., size, thickness, layout, composition etc.) of the membrane 140 may be based on a particular manufacturer or model of the mobile electronic communication device 10.

In some embodiments, the membrane 140 is fixed by, for example (but not limited to) adhesive, surface tension, friction, static cling, viscous fluid, one or more fasteners, a combination thereof, and/or the like, to one or more of the protective case 100 (e.g., the front cover 110, the rear cover 120, etc.) or the mobile electronic communication device 10.

In other embodiments, the membrane 140 is not fixed to the protective case 100 or the mobile electronic communication device 10. That is, the membrane 140 is a separate component from the front cover 110 and the rear cover 120. In such embodiments, the membrane 140 may be held in place against the mobile electronic communication device 10 by coupling (e.g., clamping, fastening, etc.) the front cover 110 and the rear cover 120 together.

In various embodiments, the membrane 140 is placed over the front surface of the mobile electronic communication device 10 received in the cavity 135 and rests on the front surface of the mobile electronic communication device 10 to allow user interaction with the user input interface of the mobile electronic communication device 10 through the membrane 140. In particular embodiments, a rear surface (the surfacing facing downward in the orientation of FIG. 2) of the membrane 140 is arranged to contact the front surface of the mobile electronic communication device 10.

In various embodiments, the protective case 100 includes alignment features configured to assist with alignment of the membrane 140 relative to the mobile electronic communication device 10 received in the cavity 135. In particular embodiments, a portion of the protective case 100 (e.g., the liner 130) is keyed or otherwise shaped and dimensioned to receive a corresponding portion of the membrane 140. For instance, the liner 130 may include one or more recesses 132 on the sidewall 130a for receiving corresponding tab portions 142 of the membrane 140. In the illustrated embodiments, a plurality (two in FIG. 3B) of recesses 132 are provided in the sidewall 130a to extended outward from the cavity 135. Other embodiments may include more than or fewer than two recesses 132 (and tab portions 142). The recesses 132 are shaped to receive the corresponding tab portions 142 to facilitate alignment of the membrane 140. Accordingly, when the membrane 140 is placed on the front surface of the mobile electronic communication device 10, the tab portions 142 rest on upper surfaces 132a of the recesses 132. In particular embodiments, the tab portions 142 of the membrane 140 extend from a body portion 148 of the membrane 140. The body portion 148 may correspond in size and shape, for example, to the mobile electronic communication device 10 or a portion thereof (e.g., the touchscreen display or other user input interface of the mobile electronic communication device 10). Accordingly, in particular embodiments, the tab portions 142 are the only portions of the membrane 140 that extend over the sidewall 130a, or are the only portions of the membrane 140 that extend beyond the perimeter of the mobile electronic communication device 10.

In some embodiments, the front cover 110 may include one or more protrusions 113 (e.g., pin members) that are insertable through corresponding openings 143 provided in the tab portions 142, and into corresponding openings 133 provided in the recesses 132 (when the tab portions 142 are arranged in the recesses 132) to align and retain the membrane 140 over the mobile electronic communication device 10 when the front cover 110 and the rear cover 120 are coupled together. The protrusions 113 are integrally molded or formed portions of the front cover 110. In other embodiments, the protrusions are attached to the front cover 110. Alternatively or in addition, one or more of the protrusions may be provided on the rear cover 120 and the corresponding recesses may be provided in the front cover 110 such that the protrusion(s) of the rear cover 120 are insertable through the opening(s) 143 of the membrane 140 and into the recesses in the front cover 110.

In various embodiments the front cover 110 and the rear cover 120 are configured to be coupled together (with the membrane 140 covering the mobile electronic communication device 10) to form a waterproof seal (i.e., substantially prevent passage of liquid from one side of the protective case 100 (e.g., outside of the protective case 100) to the other side of the protective case 100 (e.g., inside of the protective case 100)). In some embodiments, a compressible member 150 is provided between the membrane 140 and the front cover 110 to provide a seal between the membrane 140 and the front cover 110. In particular embodiments, the compressible member 150 is attached to a front surface 140a of the membrane 140. For instance, the compressible member 150 may be attached by, for example (but not limited to), an adhesive material, one or more fasteners, a combination thereof, and/or the like to the front surface 140a of the membrane 140. In other embodiments, the compressible member 150 is similarly attached to a rear surface 110a of the front cover 110 (but not attached to the membrane 140). In yet other embodiments, the compressible member 150 is arranged in contact with, but is not attached to the membrane 140 and the front cover 110 (e.g., the compressible member 150 is a separate component from the membrane 140 and the front cover 110). In such embodiments, for example, a top surface of the compressible member 150 engages the rear surface 110a of the front cover 110 to form a seal between the compressible member 150 and the rear surface 110a of the front cover 110 and/or a bottom surface of the compressible member 150 engages the membrane 140 to form a seal between the compressible member 150 and the membrane 140.

The compressible member 150 may be a gasket (e.g., O-ring) or the like for providing a seal between the membrane 140 and the front cover 110 when the front cover 110 is coupled to the rear cover 120. In particular embodiments, the compressible member 150 is made of a foam material, such as (but not limited to) a microcellular urethane (e.g., PORON®), and/or the like.

The compressible member 150 is shaped and dimensioned to correspond to a shape and dimension of an outer perimeter of the membrane 140. The compressible member 150 extends around at least a portion (or the entire portion) of the perimeter of the membrane 140. The compressible member 150 has a first aperture 152 in alignment with the first aperture 112 of the front cover 110 to allow access to the touchscreen interface of the mobile electronic communication device 10 through the membrane 140. In some embodiments, the compressible member 150 has at least one second aperture 158 in alignment with the second aperture(s) 118 of the front cover 110 to allow access to at least one portion (e.g., front-facing camera, proximity sensor, etc.) of the mobile electronic communication device 10. Accordingly, the compressible member 150 provides a separate seal around the second aperture 158 (i.e., separate from the seal around the first aperture 152). In some embodiments, the compressible member 150 may have an operator aperture 151 over an operator of the mobile electronic communication device 10 (e.g., Home button 11). The operator aperture 151 is aligned with a corresponding aperture 141 of the membrane 140. Accordingly, the compressible member 150 provides a separate seal around the operator of the mobile electronic communication device 10 (i.e., separate from the seal around the first aperture 152).

In some embodiments, the front cover 110 is configured to assist with alignment of the compressible member 150 (and/or the membrane 140). In particular embodiments, a portion of the protective case 100 (e.g., the front cover 110) is keyed or otherwise shaped and dimensioned to receive the compressible member 150. For instance, the rear surface 110a of the front cover 110 may include a recess 110b or the like shaped and dimensioned to receive at least a portion of the compressible member 150 when the front cover 110 is coupled to the rear cover 120. In such embodiments, the compressible member 150 may seal against a surface 110c of the recess 110b when the front cover 110 is coupled to the rear cover 120.

In some embodiments, the liner 130, such as the sidewall 130a of the liner 130, includes a rib 131 arranged around at least a portion of an inner perimeter of the liner 130. In particular embodiments, the rib 131 is arranged around the entire inner perimeter of the liner 130. The rib 131 extends upward from a top surface of the sidewall 130a to engage the front cover 110 when the front cover 110 is coupled to rear cover 120. In such embodiments, the rib 131 seals against the rear surface 110a of the front cover 110 when the front cover 110 is coupled to the rear cover 120.

In particular embodiments, the rib 131 contacts an outer peripheral surface 110d of the rear surface 110a of the front cover 110 when the front cover 110 is coupled to the rear cover 120. In such embodiments, the rib 131 may seal against the outer peripheral surface 110d when the front cover 110 is coupled to the rear cover 120. The rib 131 may contact the outer peripheral surface 110d at a location X across from the compressible member 150. That is, the location X at which the rib engages the outer peripheral surface 110d is between the upper surface of the compressible member 150 and the lower surface of the compressible member 150 (or upper surface 140a of the membrane 140). In further embodiments, the rib 131 is arranged to surround at least a portion of one or more of the recesses 132. In some embodiments, a gap 132 is provided between the outer peripheral surface 110d at the sidewall 130a.

Thus, in various embodiments, a first seal (or inner seal) is provided at the surface 110c of the front cover 110 with the compressible member 150 and a second seal (or outer seal) is provided at the outer peripheral surface 110d of the front cover 110 with the rib 131. In particular embodiments, the second seal is arranged further from a top surface of the front cover 110 than the first seal. That is, the second seal is provided in further inward along the rear cover 120 than the first seal.

The front cover 110 and the rear cover 120 may be coupled in any suitable manner, such as (but not limited to) friction fitting, snap fitting, clasping mechanism, clamping/fastening member, and/or the like. For instance, the front cover 110 may include openings 117 and the rear cover 120 may include openings 137 that are in alignment with each other when the front cover 110 and the rear cove 120 are brought together for coupling. In various embodiments, one or more coupling member, such as (but not limited to) screws 117a, bolts, and/or the like may be provided in the openings 117, 137 to fasten the front cover 110 to the rear cover 120. In particular embodiments, the openings 137 (and/or the openings 117) may be threaded to threadingly engage the screws 117a. The coupling member(s) may be provided at each corner of the protective case 100 or at any other suitable location(s). In particular embodiments, the coupling members exert a force on the front cover 110 and/or the rear cover 120 to force the front cover 110 against the compressible member 150 to provide the seal between the transparent member 140 and the front cover 120. By increasing the force exerted by the coupling member(s), the seal strength may be increased to further inhibit passage of fluid, dust, or the like, between the compressible member 150 and the front cover 110. According to various embodiments, when the front cover 110 and the rear cover 120 are coupled together, an enclosed volume is formed for holding the mobile electronic communication device 10.

The mobile electronic communication device 10 may include at least one camera or other video/image/data capture device. In particular embodiments, the protective case 100 is configured to allow an image or the like to be captured through the protective case 100. In particular embodiments, the rear cover 120 includes an opening 139 arranged to align with a lens of a rear-facing camera of the mobile electronic communication device 10. In further embodiments, the opening 139 is covered by a transparent portion (e.g., an optically clear lens) arranged to align with the camera lens, and/or the like. The transparent portion may be formed as an integral feature of the protective case 100 or may be a separate part formed separately and assembled to the protective case 100. In some embodiments, the protective case 100 includes a movable door arranged over the lens to selectively open to allow the camera to capture an image of an object outside the protective case 100. In some embodiments, the front cover 110 may be configured to allow an image or the like to be captured through the protective case 100 by a front-facing camera. For example, the front cover 110 may include the second aperture 118 or otherwise provide access to the front-facing camera of the mobile electronic communication device 10.

The mobile electronic communication device 10 may have one or more indicator lights on one or more suitable portions of the mobile electronic communication device 10 to indicate information, such as a status light for power, communication, battery status, or other functions (e.g., new voicemail, email, text message, or other message). The indicator lights may be in positions on the mobile electronic communication device 10 that are not readily viewable through the membrane 140 or other portion of the protective case 100. In particular embodiments, the protective case 100 may be configured to allow the indicator lights to be visible through at least a portion of the protective case 100. For example, the front cover 110 and/or the rear cover 120 of the protective case 100 includes one or more transparent portions, light pipes, or the like that transmit light from the mobile electronic communication device 10 to outside of the protective case 100. The transparent portions may be constructed of a transparent (or semi-transparent) material. The transparent portions may be formed as an integral feature of the protective case 100 or may be separate parts that are formed separately and assembled to the protective case 100.

The mobile electronic communication device 10 may include one or more audio devices, such as speakers, headphone jacks, microphones for receiving audio signals, etc. In particular embodiments, the protective case 100 may be configured to transmit audio signals through the protective case 100 to the audio devices. For example, the front cover 110 and/or the rear cover 120 of the protective case 100 includes an opening 128 to one or more of the audio devices. In further embodiments, the opening 128 includes a door 128a to selectively open to allow access to the opening 128 for the speaker and/or microphone jack. In particular embodiments, the door 128a is configured to pivot, slide, or open in any suitable manner that allows access to the opening 128. In other embodiments, the protective case 10 includes a film, membrane, or other material adapted to allow sound to pass through the film to or from one or more of the audio devices, yet inhibit passage of fluid, dust, or the like to the audio devices. For example, the membrane 140 includes an opening 144 over a speaker of the mobile electronic communication device 10. A film 146 is provided over the opening 144 to allow sound to pass through the opening 144 and the film 146. The film 146 is attached (e.g., via an adhesive, fastener, etc.) to the rear surface 140a of the membrane 140. In such embodiments, the film 146 is arranged between the mobile electronic communication device 10 and the membrane 140. In other embodiments, the film 146 is attached to the front surface 140a of the membrane 140. In such embodiments, the film 146 is arranged between the membrane 140 and the front cover 110. In other embodiments, the film 146 is an integral part of the membrane 140.

The mobile electronic communication device 10 may have at least one interface for communicating with another device (e.g., a computer, a speaker, a charging device, etc.) and/or for charging the mobile electronic communication device 10. The interface may be a direct electrical connection, such as through a cable, for example (but not limited to a USB cable and/or the like. Alternatively or in addition, the interface may be a wireless connection, for example (but not limited to) Wi-Fi, Bluetooth, and/or the like. In particular embodiments, the protective case 100 may be configured to allow access to one or more of the interfaces, such as an interface that allows for a direct electrical connection. For example, the protective case 100 may include an interface opening 129 that aligns with the interface of the mobile electronic communication device 10 when the mobile electronic communication device 10 is received in the cavity 135 of the protective case 100. In further embodiments, the interface opening 129 may include a door 129a or the like for allowing selective access to the interface opening 129 to the interface of the mobile electronic communication device 10. In particular embodiments, the door 129a is configured to pivot, slide, or open in any suitable manner that allows access to the opening 129.

The mobile electronic communication device 10 includes one or more operators (e.g., buttons, switches, etc.) as part of the user input interface for the mobile electronic communication device 10. The operator(s) may provide various functions, such as powering on/off the mobile electronic communication device, changing a volume of the mobile electronic communication device 10, toggling audio/vibration (e.g., ringer of the mobile electronic communication device 10), or performing other functions on the mobile electronic communication device 10 (e.g., a "Home" button). The button size, number of, layout, and function may vary for each manufacturer and model of mobile electronic communication device 10.

As such, in various embodiments, the protective case 100 may be configured to allow actuation of one or more operators of the mobile electronic communication device 10 while the mobile electronic communication device 10 is in the protective case 100. For instance, the protective case 100 may include one or more members or other features that are arranged to interact with one or more of the mobile electronic communication device 10 operators. In some embodiments, a moveable member may be provided on the protective case 100 at a position to interact with the one or more operators of the mobile electronic communication device 10 (received in the cavity 135) to transmit mechanical motion from outside of the protective case 100 to the one or more operators of the mobile electronic communication device 10. In particular embodiments, the moveable member may be a flexible or pliable member or portion of the protective case 100. For example, a flexible member 111 may be arranged in the front cover 110 to transmit a force applied to the flexible member 111 to a Home button 11 of the mobile electronic communication device 10. In some embodiments, the moveable member may be a moveable body, such as a plunger or the like, configured to transmit mechanical movement from outside of the protective case 100 to one or more of the operators of the mobile electronic communication device 10. For example, a plunger 127 may be provided in the rear cover 120 to transmit a force applied to the plunger 127 to the power button of the mobile electronic communication device 10. As another example, a first button plunger 123a (corresponding to volume up button 13) and a second button plunger 123b (corresponding to volume down button 14) may be provided in the rear cover 120 to transmit a force applied to the volume up button 13 or volume down button 14. Thus in various embodiments, movement of a feature of the protective case 100 may move in a same (or parallel) direction as a direction in which a corresponding operator of the mobile electronic communication device 10 is moved. In some embodiments, the protective case 100 is configured to provide access to one or more of the mobile electronic communication device 10 operators. For example, the protective case 100 may include an opening to allow a user to access (e.g., actuate) one or more of the mobile electronic communication device 10 operators. It should be noted that the mobile electronic communication device 10 may include any suitable type or number of operators and/or the protective case 100 may include any suitable type or number of members arranged to interact with such operators. For example, the protective case 100 may include a pivoting or rocking member for actuating (at least) two of the operators (e.g., volume up button 13 and volume down button 14) of the mobile electronic communication device 10.

With reference to FIGS. 1-8B, in some embodiments, the protective case 100 includes at least one rotatable member 125 configured to transmit mechanical (rotational) movement to a corresponding operator of the mobile electronic communication device 10, such as (but not limited to) the audio/vibration (AV) switch 12. Such a switch 12 is configured for linear movement relative to a linear dimension (e.g., height dimension) of the mobile electronic communication device 10. For instance, the AV switch 12 is configured for movement in a first direction (e.g., toward a front surface of the mobile electronic communication device 10) to a first position P1, which provides a first state (e.g., "ON"), and a second direction (e.g., toward a rear surface of the mobile electronic communication device 10) opposite the first direction to a second position P2, which provides a second state (e.g., "OFF").

In various embodiments, the rotatable member 125 is configured to rotate to actuate the AV switch 12 (at least) between the first position P1 and the second position P2. The rotatable member 125 may be provided in an opening 134 through the peripheral wall 120a of the rear cover 120 to allow the rotatable member 125 to engage the AV switch 12 of the mobile electronic communication device 10 when the mobile electronic communication device 10 is received in the cavity 135. Thus, the rotatable member 125 is rotatable relative to the rear cover 120 (or other suitable portion of the protective case 100) about a first axis A that is transverse to the dimension along which the AV switch 12 moves.

In some embodiments, the rotatable member 125 includes a first engagement surface 224a and a second engagement surface 224b that selectively engage the AV switch 12 as the rotatable member 125 is rotated. After engagement between the AV switch 12 and the first engagement surface 224a or the second engagement surface 224b, further rotation of the rotatable member 125 causes the engaged surface 224a, 224b of the rotatable member 125 to push or otherwise move the AV switch 12 in a corresponding direction.

Accordingly, in particular embodiments, the rotatable member 125 is configured such that the first engagement surface 224a causes the AV switch 12 to move in the second direction from the first state (e.g., "ON") to the second state (e.g., "OFF") when the rotatable member 125 is rotated in a first direction R1 (e.g., clockwise). In addition, the rotatable member 125 is configured such that the second engagement surface 224b causes the AV switch 12 to move in the first direction from the second state to the first state when the rotatable member 125 is rotated in a second direction R2 (e.g., counterclockwise).

In some embodiments, the rotatable member 125 is configured to be rotatable in the second direction R2 (at least) until the rotatable member 125 reaches a first rotation position A1. The first rotation position A1 may correspond to the first position P1 of the AV switch 12 at which the AV switch 12 is in the first state (e.g., "ON"). Moreover, the rotatable member 125 is configured to be rotatable in the first direction R1 (at least) until the rotatable member 125 reaches a second rotation position A2. The second rotation position A2 may correspond to the second position P2 of the AV switch 12 at which the AV switch 12 is in the second state (e.g., "OFF").

In further embodiments, the rotatable member 125 includes an indicator 125a for indicating a position of the rotatable member 125, for example, relative to the first rotation position A1 and the second rotation position A2. One or more markers or indicators 126 may be provided on the rear cover 120 to indicate the location of the first rotation position A1 and/or the second rotation position A2. Because the rotation positions A1, A2 correspond to a state of the AV switch 12, a user can readily determine the state of the AV switch 12 based on the rotation position of the rotatable member 125. For example, when the indicator 125a is aligned with the marker 126, the user can determine that the AV switch 12 is "OFF."

In further embodiments, the rotatable member 125 includes a stop member 226 for preventing continued rotation of the rotatable member 125 in the first direction R1 and/or the second direction R2. For example, the stop member 226 engages a first stop surface 134a in the rear cover 120 as the rotatable member 125 is rotated in the second direction R2. Upon engaging, the first stop surface 134a inhibits continued rotation of the rotatable member 125 in the same direction. In addition, the stop member 226 engages a second stop surface 134b in the rear cover 120 as the rotatable member 125 is rotated in the first direction R1. Upon engaging, the second stop surface 134b inhibits continued rotation of the rotatable member 125 in the same direction.

In some embodiments, the rotatable member 125 includes a first portion 125a and a second portion 125b coupled to the first portion 125a. The first portion 125a may include a head portion 211 and a neck portion 212 having a recess 213 for receiving a portion of the second portion 125b. The second portion 125b may include a body 221 and a tab 222 received in the recess 213 of the neck portion 212 to couple the first portion 125a and the second portion 125b. The first portion 125a may be coupled to the second portion 125 in any suitable manner including (but not limited to), friction fitting, snap fitting, adhesive, fasteners, combination thereof, and/or the like. Accordingly, rotation of the first portion 125a causes rotation of the second portion 125b. In other embodiments, the rotatable member 125 may be a unitary body or contain more than two portions.

Although various embodiments relate to a rotatable member for actuating the AV switch 12, in other embodiments, any one or more of the other features of the protective case 100 may be a rotatable member for actuating the corresponding operator of the mobile electronic communication device 10.

It is to be understood that although particular embodiments of the protective case 100 are for encasing a mobile electronic communication device 10, the object to be housed in the protective case 100 may be any of a number of different objects. In addition, it should be noted that the protective case 100 may have a number of different suitable shapes, sizes, and configurations. For instance, in some embodiments, the protective case 100 may include two separate members (e.g., separate individual front and rear covers 110, 120) that are configured for being removably coupled together to surround the mobile electronic communication device 10 and thereby enclose the mobile electronic communication device 10. In other embodiments, the top and bottom covers 110, 120 may not be separate members, but rather may be members that are joined, for instance, by a common hinge element, or a single member configured for being folded upon itself and thereby forming the housing.

In other embodiments, the mobile electronic communication device 10 is received in the front cover 110 instead of the rear cover 120. In particular embodiments, the membrane 140 is attached directly to the front cover 110. The mobile electronic communication device 10, for example, may received into a cavity defined by the front cover 110 and the membrane 140 to position the front surface of the mobile electronic communication device 10 with the bottom surface of the membrane 140. In some embodiments, the membrane 140 forms a flush, front surface of the protective case 100. That is, the front surface of the protective case 100 is the uppermost surface of the protective case 100.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. The scope of the invention is indicated by the attached claims, rather than the embodiments. Various modifications and changes that come within the meaning and range of equivalency of the claims are intended to be within the scope of the invention.

What is claimed is:

1. A protective case for a mobile electronic communication device having a user input interface, the protective case comprising:
   a rear cover;
   a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume;
   a transparent membrane provided between the front cover and the rear cover to be disposed over the user input interface of the mobile electronic communication device when the mobile electronic communication device is received in the volume and the front cover is coupled to the rear cover; and
   a compressible member made of a material separate from the transparent membrane and arranged between the front cover and the membrane and separate from the front cover, the compressible member configured to provide a seal between the transparent membrane and the front cover when the mobile electronic communication device is received in the volume and the front cover is coupled to the rear cover.

2. The protective case of claim 1, wherein the compressible member is attached to the transparent membrane.

3. The protective case of claim 1, wherein the transparent membrane is not attached to the front cover.

4. The protective case of claim 1, wherein the transparent membrane and the compressible member are removable from the front cover and the rear cover.

5. The protective case of claim 1, wherein the compressible member is arranged to seal against a first rear surface of the top cover around the aperture of the top cover when the mobile electronic communication device is received in the volume and the front cover is coupled to the rear cover.

6. The protective case of claim 5,
wherein the rear cover has a peripheral wall having a top surface facing the front cover when the front cover is coupled to the rear cover;
wherein the rear cover includes a rib extending upward from the top surface of the peripheral wall and around at least a portion of the volume; and
wherein the rib is arranged to seal against a second rear surface of the top cover when the mobile electronic communication device is received in the volume and the front cover is coupled to the rear cover.

7. The protective case of claim 6, wherein the second rear surface is arranged further from the top surface of the front cover than the first rear surface.

8. The protective case of claim 6, wherein the first rear surface is arranged closer to a center point of the protective case than the second rear surface.

9. The protective case of claim 1,
wherein the rear cover has a peripheral wall having a top surface facing the front cover when the front cover is coupled to the rear cover;
wherein the rear cover includes a rib extending upward from the top surface of the peripheral wall and around at least a portion of the volume; and
wherein the rib is arranged to seal against a rear surface of the top cover when the mobile electronic communication device is received in the volume and the front cover is coupled to the rear cover.

10. The protective case of claim 1, wherein the protective case is configured to provide a first seal between the compressive member and a first surface of the front cover and a second seal between a rib portion of a peripheral wall of the rear cover and a second surface of the front cover.

11. The protective case of claim 10, wherein the second seal is arranged further from the top surface of the front cover than the first seal.

12. The protective case of claim 10, wherein the first seal is arranged closer to a center point of the protective case than the second seal.

13. The protective case of claim 1, further comprising:
at least one coupling member for coupling the front cover to the rear cover.

14. The protective case of claim 13, wherein the at least one coupling member is configured to force the front cover against the compressible member to enhance the seal between the transparent membrane and the front cover when the mobile electronic communication device is received in the volume and the front cover is coupled to the rear cover.

15. The protective case of claim 1, wherein the compressible member is adhered to the transparent membrane with an adhesive.

16. The protective case of claim 1, wherein the compressible member comprises a foam material.

17. The protective case of claim 1, wherein the compressible member comprises a urethane material.

18. The protective case of claim 1, wherein the compressible member defines an aperture aligned with the aperture of the front cover and the user input interface of the mobile electronic communication device when the mobile electronic communication device is received in the volume and the front cover is coupled to the rear cover.

19. The protective case of claim 1, wherein at least a portion of the transparent membrane is configured to be received on at least a portion of the rear cover.

20. A protective case for a mobile electronic communication device having a user input interface, the protective case comprising:
a rear cover;
a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume;
a transparent membrane provided between the front cover and the rear cover to be disposed over the user input interface of the mobile electronic communication device when the mobile electronic communication device is received in the volume and the front cover is coupled to the rear cover; and
a compressible member arranged between the front cover and the membrane and separate from the front cover, the compressible member configured to provide a seal between the transparent membrane and the front cover when the mobile electronic communication device is received in the volume and the front cover is coupled to the rear cover;
wherein the transparent membrane comprises a body portion and at least one tab portion extending from the body portion; and
wherein the at least one tab portion is configured to extend over at least a portion of a peripheral wall of the rear cover.

21. The protective case of claim 20, wherein the at least one tab portion is received into a recess provided in the peripheral wall of the rear cover.

22. The protective case of claim 1,
wherein the transparent membrane comprises a body portion and at least one tab portion extending from the body portion; and
wherein the at least one tab portion is configured to extend beyond a periphery of the mobile electronic communication device when the mobile electronic communication device is received in the volume and the front cover is coupled to the rear cover.

23. A protective case for a mobile electronic communication device having a user input interface, the protective case comprising:
a rear cover;
a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume;

a transparent membrane provided between the front cover and the rear cover to be disposed over the user input interface of the mobile electronic communication device when the mobile electronic communication device is received in the volume and the front cover is coupled to the rear cover; and a compressible member arranged between the front cover and the membrane and separate from the front cover, the compressible member configured to provide a seal between the transparent membrane and the front cover when the mobile electronic communication device is received in the volume and the front cover is coupled to the rear cover;

wherein the transparent membrane comprises a body and at least one tab portion extending from the body portion, the transparent membrane including an opening through each of the least one tab portion;

wherein the rear cover includes at least one opening, each opening at a position to align with a corresponding one of the at least one opening of the transparent membrane when the mobile electronic communication device is received in the volume and the front cover is coupled to the rear cover; and wherein the front cover includes at least one protrusion at one or more positions to extend through a corresponding one of the at least one opening of the transparent membrane and into a corresponding one of the at least one opening of the rear cover when the mobile electronic communication device is received in the volume and the front cover is coupled to the rear cover.

24. The protective case of claim 23, wherein the at least one opening of the rear cover is provided in a peripheral wall of the rear cover.

25. A protective case for a mobile electronic communication device having a user input interface, the protective case comprising:

a rear cover;

a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume;

a transparent membrane provided between the front cover and the rear cover to be disposed over the user input interface of the mobile electronic communication device when the mobile electronic communication device is received in the volume and the front cover is coupled to the rear cover; and a compressible member arranged between the front cover and the membrane and separate from the front cover, the compressible member configured to provide a seal between the transparent membrane and the front cover when the mobile electronic communication device is received in the volume and the front cover is coupled to the rear cover;

wherein the transparent membrane includes at least one opening through the transparent membrane;

wherein the rear cover includes at least one opening, each at a position to align with a corresponding one the at least one opening of the transparent membrane when the mobile electronic communication device is received in the volume and the front cover is coupled to the rear cover; and wherein the front cover includes at least one protrusion at one or more positions to extend through a corresponding one of the at least one opening of the transparent membrane and into a corresponding one of the at least one opening of the rear cover when the mobile electronic communication device is received in the volume and the front cover is coupled to the rear cover.

26. The protective case of claim 1, wherein the mobile electronic communication device is a separate unit from the protective case.

27. The protective case of claim 1, wherein the user input interface of the mobile electronic communication device is a touchscreen display.

28. A method of manufacturing a protective case for a mobile electronic communication device having a user input interface, the method comprising:

providing a rear cover;

configuring a front cover configured to couple with the rear cover, the front cover and the rear cover defining a volume for receiving the mobile electronic communication device when the front cover is coupled to the rear cover, the front cover having an aperture aligned with the user input interface of the mobile electronic communication device when the mobile electronic communication device is received in the volume;

providing a transparent membrane provided between the front cover and the rear cover to be disposed over the user input interface of the mobile electronic communication device when the mobile electronic communication device is received in the volume and the front cover is coupled to the rear cover; and arranging a compressible member made of a material separate from the transparent membrane between the front cover and the membrane and separate from the front cover, the compressible member configured to provide a seal between the transparent membrane and the front cover when the mobile electronic communication device is received in the volume and the front cover is coupled to the rear cover.

29. The protective case of claim 1, wherein the compressible member has a top surface that engages and seals against a surface of the front cover, and wherein the compressible member has a rear surface that engages the transparent membrane.

* * * * *